US011092650B2

(12) United States Patent
Simpson et al.

(10) Patent No.: US 11,092,650 B2
(45) Date of Patent: *Aug. 17, 2021

(54) RE-PROGRAMMABLE SELF-TEST

(71) Applicant: TEXAS INSTRUMENTS INCORPORATED, Dallas, TX (US)

(72) Inventors: Neil John Simpson, Rockwall, TX (US); Alan David Hales, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/371,316

(22) Filed: Apr. 1, 2019

(65) Prior Publication Data

US 2019/0227122 A1    Jul. 25, 2019

Related U.S. Application Data

(63) Continuation of application No. 15/666,789, filed on Aug. 2, 2017, now Pat. No. 10,247,780.

(51) Int. Cl.
*G01R 31/28* (2006.01)
*G01R 31/3187* (2006.01)
*G01R 31/3183* (2006.01)
*G01R 31/317* (2006.01)
*G11C 29/12* (2006.01)
*G11C 29/10* (2006.01)
*G11C 29/36* (2006.01)

(52) U.S. Cl.
CPC ..... *G01R 31/3187* (2013.01); *G01R 31/3183* (2013.01); *G01R 31/31724* (2013.01); *G01R 31/318335* (2013.01); *G01R 31/318385* (2013.01); *G11C 29/10* (2013.01); *G11C 29/12* (2013.01); *G11C 29/36* (2013.01); *G11C 2029/3602* (2013.01)

(58) Field of Classification Search
CPC ............ G01R 31/3187; G01R 31/3183; G01R 31/318385; G01R 31/318335; G01R 31/31724; G11C 29/10; G11C 29/36; G11C 29/12; G11C 2029/3602
USPC ........ 714/724, 726, 727, 728, 733, 738, 742
See application file for complete search history.

(56) References Cited

U.S. PATENT DOCUMENTS 5,572,712 A    11/1996 Jamal
6,684,358 B1*  1/2004 Rajski .............. G01R 31/31813
                                                        714/728
7,603,603 B2   10/2009 Dubey
(Continued)

Primary Examiner — Albert Decady
Assistant Examiner — Osman M Alshack
(74) Attorney, Agent, or Firm — Charles F. Koch; Charles A. Brill; Frank D. Cimino

(57) ABSTRACT

A built-in self-test (BIST) method includes providing expanded test patterns to a logic circuit under test, generating a first signature based on a response of the logic circuit to the expanded test patterns, generating a second signature based on the first signature, wherein the second signature is a compressed version of the first signature, selecting one of the first signature or the second signature in response to a control signal, comparing the selected one of the first signature or the second signature to an expected signature, and, based on the comparison of the selected one of the first signature or the second signature to the expected signature, determining that the logic circuit passes or fails BIST.

16 Claims, 3 Drawing Sheets

(56) References Cited

U.S. PATENT DOCUMENTS

| | | | |
|---|---|---|---|
| 9,704,599 B1* | 7/2017 | Katoch | G11C 29/027 |
| 10,078,114 B2* | 9/2018 | Iwata | G01R 31/3177 |
| 2004/0064771 A1* | 4/2004 | Appinger | G01R 31/318335 |
| | | | 714/733 |
| 2005/0060625 A1* | 3/2005 | Wang | G01R 31/318547 |
| | | | 714/727 |
| 2006/0015787 A1* | 1/2006 | Wang | G01R 31/318335 |
| | | | 714/726 |
| 2007/0033468 A1* | 2/2007 | Hilgendorf | G01R 31/318536 |
| | | | 714/733 |
| 2011/0029813 A1* | 2/2011 | Gunderson | G11C 29/802 |
| | | | 714/30 |
| 2011/0238878 A1 | 9/2011 | Welguisz et al. | |
| 2011/0239070 A1 | 9/2011 | Morrison | |
| 2011/0307750 A1 | 12/2011 | Narayanan et al. | |
| 2013/0051158 A1* | 2/2013 | Matsuo | G11C 29/24 |
| | | | 365/189.07 |
| 2014/0006889 A1* | 1/2014 | Motika | G01R 31/318547 |
| | | | 714/732 |
| 2014/0053035 A1* | 2/2014 | Harper | G01R 31/3187 |
| | | | 714/733 |
| 2014/0082453 A1 | 3/2014 | Sikdar et al. | |
| 2016/0245863 A1* | 8/2016 | Mrugalski | G01R 31/318547 |
| 2017/0363685 A1 | 12/2017 | Douskey et al. | |

* cited by examiner

RE-PROGRAMMABLE SELF-TEST

CROSS-REFERENCE TO RELATED APPLICATION(S)

This application is a continuation of U.S. patent application Ser. No. 15/666,789 filed on Aug. 2, 2017, which is incorporated herein by reference.

TECHNICAL FIELD

The technical field of this disclosure relates to built-in self-test (BIST).

BACKGROUND

Today's Systems on a Chip (SoC) have very high level of integration with multiple voltage regulators, voltage monitors, analog to digital and digital to analog converters, power on reset controllers and other systems which significantly increase the scope and complexity of manufacturing test coverage as well as the cost of testing.

During its lifetime, a digital system is tested and diagnosed on numerous occasions. For the system to perform its intended mission with high availability, testing and diagnosis must be quick and effective. A sensible way to ensure this is to specify test as one of the system functions—in other words, self-test.

Digital systems involve a hierarchy of parts: chips, boards, cabinets, and so on. At the highest level, which may include the entire system, the operation is controlled by software. Self-test is often implemented in software. While a purely software approach to self-test may suffice at the system level, it has several disadvantages. Such testing may have poor diagnostic resolution because it must test parts designed without specific testability considerations. In addition, a good software test can be very long, slow, and expensive to develop.

An attractive alternative is built-in self-test, (BIST) that is, self-test implemented in hardware.

The basic BIST architecture requires the addition of three hardware modules to a digital circuit: a pattern generator; a response analyzer; and a test controller.

Examples of pattern generators are a ROM with stored patterns, a counter, or a linear feedback shift register (LFSR). A typical response analyzer is a comparator with stored responses or a signature analyzer. The signature analyzer may be implemented in a number of ways known in the art, with the most common being a Multiple Input Shift Register (MISR).

A control module is usually required to activate the test and analyze the responses.

SUMMARY

Self-test solutions have been well known for many years, but they have always been limited by the fixed nature of the coverage that can be achieved. Including the re-programmability option shown in this invention through employing a one time programmable eFuse for the Pseudo Random Pattern Generator (PRPG) seed data input and the Multiple Input Shift Register (MISR) signature output comparison, provides an enhanced capability to increase the coverage of the self-test solution after manufacture.

BRIEF DESCRIPTION OF THE DRAWINGS

These and other aspects of this invention are illustrated in the drawings, in which.

DETAILED DESCRIPTION

Figure 1:
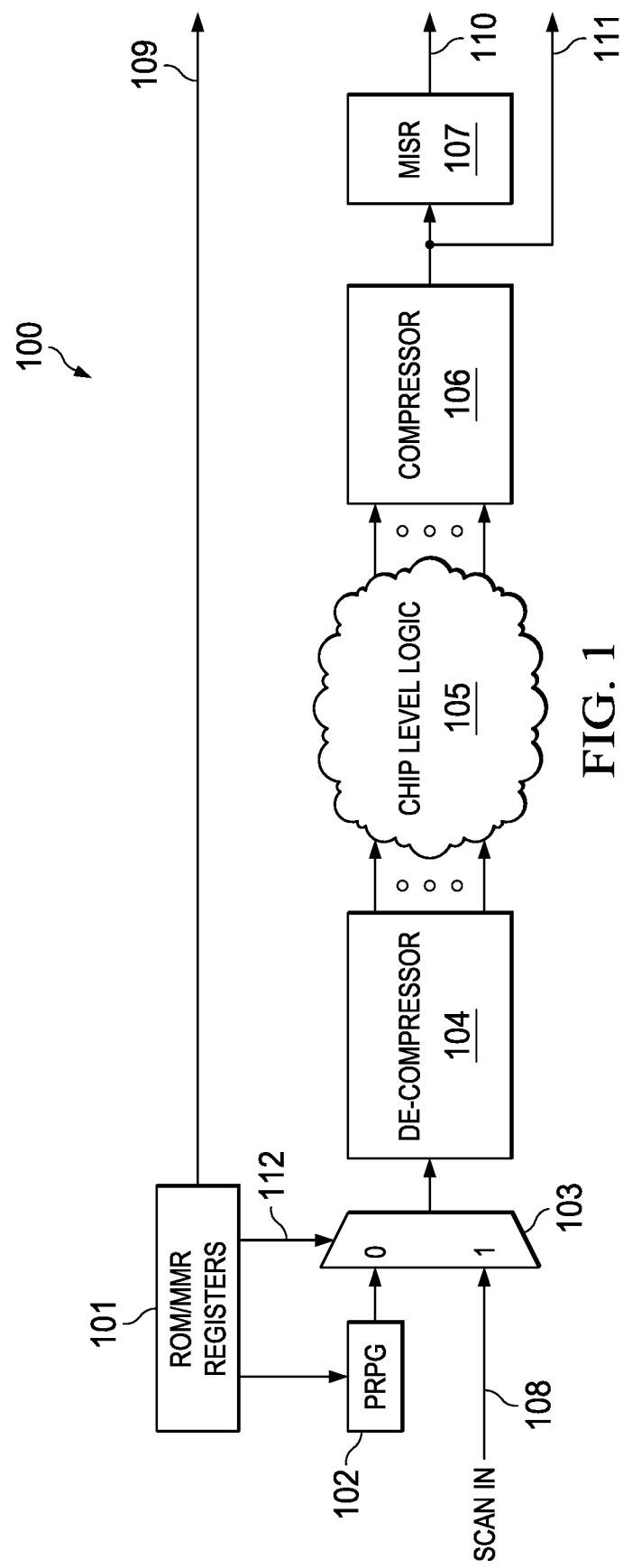
FIG. 1 shows a BIST circuit as implemented in the prior art.

FIG. 1 shows an implementation of a BIST circuit as known in the prior art. Test patterns are generated by a PRPG 102 that may be implemented in various ways known in the art, but usually as an LFSR that generates a pseudo random sequence starting from a given initial seed. Seeds for the PRPG 102 and the corresponding MISR signatures are stored in read only memory/memory mapped register file 101. The seeds are provided to PRPG 102. The output of PRPG 102 is connected to a first input of selector 103. Selector 103 is operable to select either the output of PRPG 102, or an external scan input signal 108, dependent upon the state of control signal 112. The output of selector 103 is connected to de-compressor/expander 104. This module expands the input pattern using several possible, symmetrical methods known in the art such as a Linear Feedback Shift Register (LFSR), and connects the expanded output to the circuit under test 105. The resulting output of circuit under test 105 is connected to compressor 106 which compresses the output data using the reverse of the method that was used in de-compressor/expander 104, typically using an LFSR. The output of compressor 106 is provided to optional external test equipment on scan output line 111, and to the input of MISR module 107. The output of MISR module 107 is the signature of the test result. This result is provided to an external comparator via line 110, to be compared to the expected output provided from module 101 on line 109. Depending on the implementation, compressor 106 and MISR module 107 may be combined into one circuit module.

Figure 2:
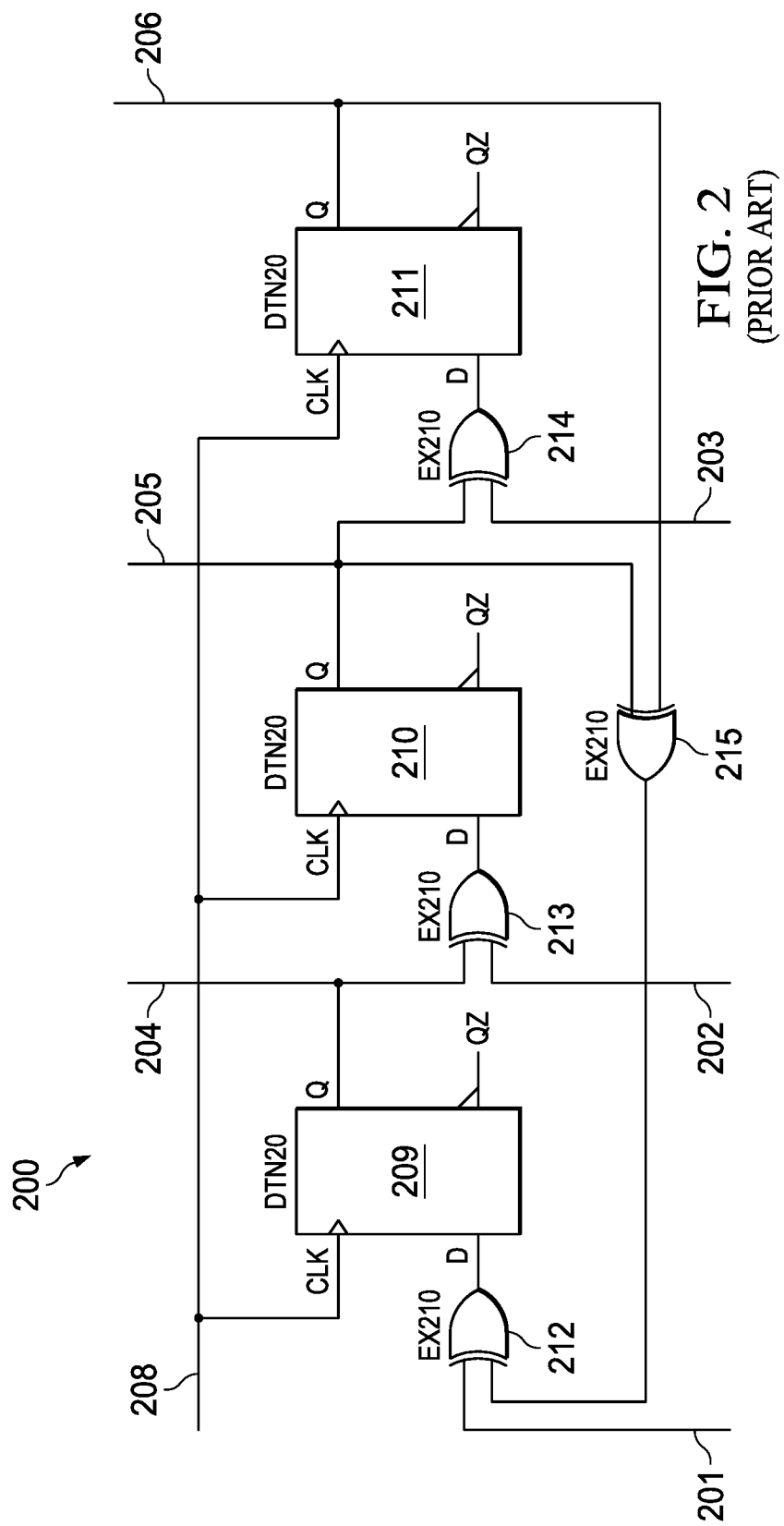
FIG. 2 shows a MISR circuit of the prior art.

FIG. 2 shows an exemplary implementation of a 3 stage LFSR. This is well known in the art, and may be used in the PRPG 102, MISR module 107, decompressor/expander 104 and compressor 106.

As shown in 200, the LFSR consists of a plurality of flip/flop register circuits 209, 210 and 211, and feedback gates 212, 213, 214 and 215. The number of flip/flop circuit stages in an implementation is dependent on the application. If the application is a PRPG, the number of stages determines the length of the pseudo random sequence before repeating. In this application, the seed, or starting point of the sequence is input on lines 201, 202 and 203 to respective XOR gates 212, 213 and 214. When the LFSR is clocked on line 208, a new member of the pseudo random sequence is output on lines 204, 205 and 206 on every clock transition.

If the application is decompression or expansion, the initial pattern is input to XOR gates 212, 213 and 214, and the output from lines 204, 205 and 206 are used as the test stimulus to the circuit under test. For each pattern input, the LFSR is clocked a plurality of times thus generating a plurality of test patterns based on each instance of the input pattern. In this application, the number of stages is dependent upon the number of test stimuli needed for the particular circuit being tested.

The compressor and MISR functions may be combined in one function, and are essentially the reverse of the de-compressor function, with the same number of stages as the compressor. The signature representing the results of the test is recovered after the same number of clock transitions in the compressor as was employed in the de-compressor.

Figure 3:
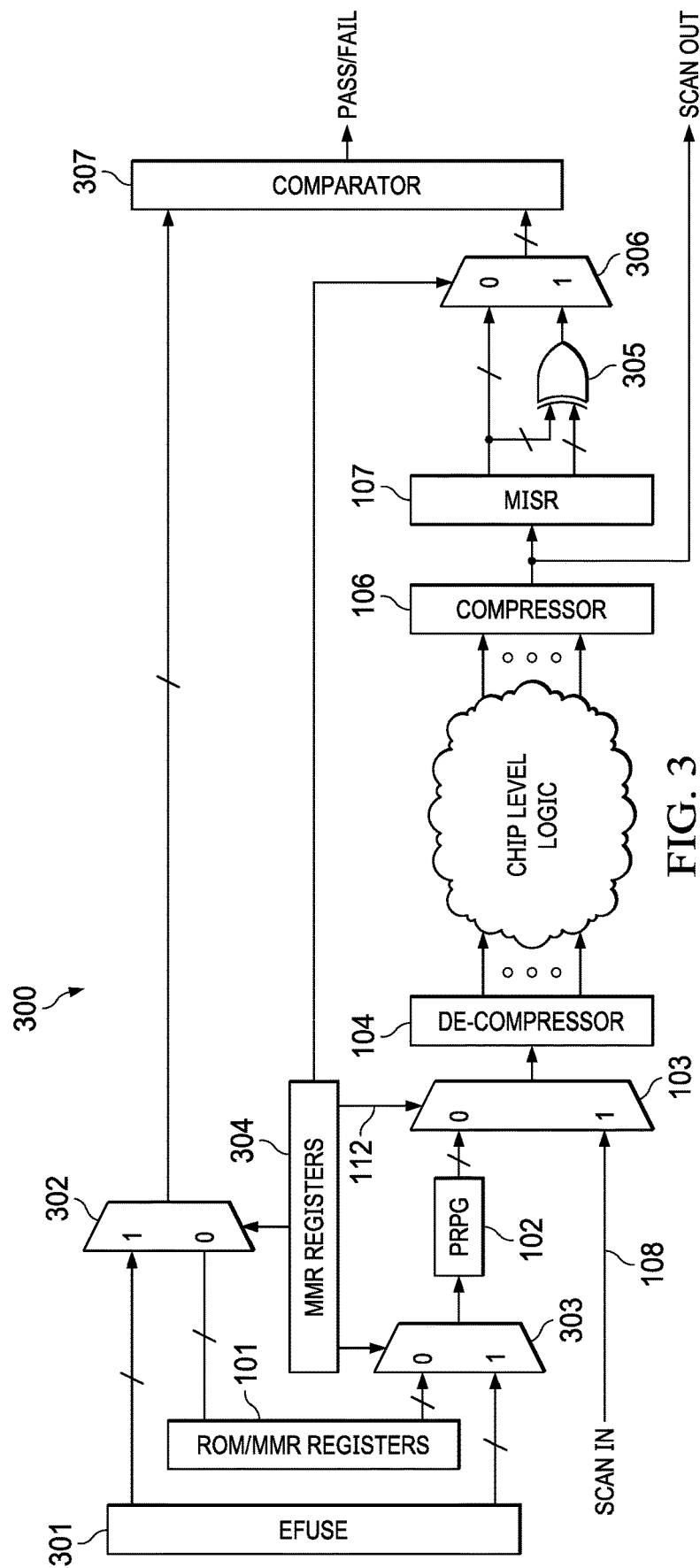
FIG. 3 shows the BIST circuit of this invention.

FIG. 3 shows the BIST circuit of the invention. The eFuse module 301 is one time programmable to hold additional seed values for the PRPG 102 and additional expected signature data corresponding to the new seeds. A first output of eFuse module 301 is connected to a first input of selector 303 to provide seed data stored in eFuse module 301 to the selector 303. A second input of selector 303 is connected to the seed output port of ROM/register bank 101. The control input of selector 303 is connected to an output from MMR control register bank 304, and the output of selector 303 is connected to PRPG 102. Selector 303 thus controls the source of the seed being used by PRPG 102. MMR control register bank 304 controls selectors 302, 303 and 306.

The first output of MISR module 107 is connected to the first input of selector 306, and to the first input of XOR module 305. The second output of MISR module 107 is connected to the second input of XOR module 305. The output of XOR module 305 is connected to the second input of selector 306. Selector 306 is controlled by an output from MMR control register bank 304 and is operable to select whether the output of selector 306 is the signature from MISR module 107, or is a further modified signature from XOR module 305. XOR module 305 further compresses the signature by masking off non-applicable parts of the signature.

The output of selector 306 is connected to a first input of comparator 307. A second input of comparator 307 is connected the output of selector 302. The output of comparator 307 is the pass/fail indication of the BIST.

The first input of selector 302 is connected to a second output of eFuse 301, and the second input of selector 302 is connected to the second (signature) output port of ROM/Register bank 101. Selector 302 thus, depending on the state of the control signal from MMR control register bank 304, selects whether the signature input to comparator 307 originates from the eFuse module 301 or from the ROM/Register module 101.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A method comprising:
   receiving, by a logic circuit under test, expanded test patterns, wherein the expanded test patterns are based on a selected seed data;
   generating, by a signature analyzer, a first signature based on a response of the logic circuit to the expanded test patterns;
   receiving, by an exclusive or (XOR) logic, the first signature;
   generating, by the XOR logic, a second signature based on the first signature, wherein the second signature is a compressed version of the first signature;
   receiving, by the selector, the first signature and the second signature;
   selecting, by the selector, one of the first signature or the second signature in response to a control signal, wherein the control signal is based on the selected seed data;
   comparing, by a comparator, the selected one of the first signature or the second signature to an expected signature; and
   based on the comparison of the selected one of the first signature or the second signature to the expected signature, determining that the logic circuit passes a built-in self-test (BIST) or fails the BIST.

2. The method of claim 1, wherein providing the expanded test patterns includes generating non-expanded test patterns, and then expanding the non-expanded test patterns to obtain the expanded test patterns.

3. The method of claim 2, wherein:
   the selected seed data includes a selected one of a first seed data or a second seed data; and
   generating the non-expanded test patterns includes using a pseudo-random pattern generator (PRPG) and supplying to the PRPG the selected one of the first seed data from a first memory or the second seed data from a second memory, and wherein the first and second memories are separate from each other.

4. The method of claim 3, wherein:
   the first memory includes at least one of a read-only memory or a memory mapped register file; and
   the second memory includes a one-time programmable (OTP) memory.

5. The method of claim 4, wherein the OTP memory is an eFuse device.

6. The method of claim 3, wherein:
   the expected signature is selected from one of a first expected signature stored in the first memory and a second expected signature stored in the second memory; and
   the first expected signature is selected when the first seed data is selected and the second expected signature is selected when the second seed data is selected.

7. The method of claim 1, wherein the response of the logic circuit includes output data in response to the expanded test patterns, and the first signature is determined by compressing the output data and supplying the compressed output data to the signature analyzer to generate the first signature.

8. The method of claim 7, wherein the signature analyzer is a multiple input shift register (MISR).

9. The method of claim 1, wherein the second signature is generated by masking a portion of the first signature using the XOR logic.

10. An integrated circuit comprising:
a testable logic circuit; and
built-in self-test (BIST) circuitry that includes:
- decompression logic configured to expand a plurality of test patterns into expanded test patterns and having an output to supply the expanded test patterns to the testable logic circuit, wherein the expanded test patterns are based on a selected seed data;
- first compression logic configured to receive output data supplied by the testable logic circuit in response to the expanded test patterns and to compress the output data to produce compressed output data;
- a signature analyzer configured to determine a first signature based on the compressed received data;
- second compression logic configured to receive the first signature and produce a second signature that is a compressed version of the first signature;
- selection logic having a first input to receive the first signature, a second input to receive the second signature, a third input to receive a control signal, and an output to output a selected one of the first signature and the second signature as a selected signature in response to the control signal, wherein the control signal is based on the selected seed data; and
- a comparator having a first input to receive the selected signature, a second input to receive an expected signature, and an output to output a value indicating whether the testable logic circuit passes BIST based on a comparison of the expected signature to the selected signature.

11. The integrated circuit of claim 10, wherein the selection logic is first selection logic and the control signal is a first control signal, and the BIST circuitry further includes:
- a first memory to store the first seed data and a first expected signature;
- a second memory to store the second seed data and a second expected signature;
- second selection logic having a first input to receive the first seed data, a second input to receive the second seed data, a third input to receive a second control signal, and an output to output a selected one of the first seed data and the second seed data as selected seed data in response to the second control signal; and
- a pseudo-random pattern generator (PRPG) configured to generate the plurality of test patterns in response to the selected seed data.

12. The integrated circuit of claim 11, wherein
the first memory includes at least one of a read-only memory or a memory mapped register file; and
the second memory includes a one-time programmable (OTP) memory.

13. The integrated circuit of claim 12, wherein the OTP memory is an eFuse device.

14. The integrated circuit of claim 11, further including third selection logic having a first input to receive an expected signature from the first memory, a second input to receive an expected signature from the second memory, a third input to receive a third control signal, and an output to output a selected one of the expected signature from the first memory and the expected signature from the second memory as the expected signature, wherein the third control signal causes the expected signature from the first memory to be selected by the third selection logic when the selected seed data is the first seed data and causes the expected signature from the second memory to be selected by the third selection logic when the selected seed data is the second seed data.

15. The integrated circuit of claim 10, wherein the signature analyzer includes a multiple input shift register (MISR).

16. The integrated circuit of claim 10, wherein the value output by the comparator indicates that the testable logic circuit passes BIST when the selected signature matches the expected signature and indicates that the testable logic circuit fails BIST when the selected signature does not match the expected signature.

* * * * *